United States Patent [19]

Laurent

[11] 4,390,596
[45] Jun. 28, 1983

[54] ENCAPSULATION OF ELECTRONIC COMPONENTS IN BIS-IMIDO POLYMER

[75] Inventor: Serge Laurent, Bron, France

[73] Assignee: Rhone-Poulenc Industries, Paris, France

[21] Appl. No.: 203,379

[22] Filed: Nov. 3, 1980

[30] Foreign Application Priority Data

Nov. 9, 1979 [FR] France ............... 79 28145

[51] Int. Cl.$^3$ ............... B32B 27/06; B29C 13/02
[52] U.S. Cl. ............... 428/473.5; 264/272.11; 264/272.13
[58] Field of Search ............... 428/473.5; 264/272.11, 264/272.13

[56] References Cited

U.S. PATENT DOCUMENTS

| Re. 29,316 | 7/1977 | Bargain et al. | 428/435 |
| 3,018,290 | 1/1962 | Sauers et al. | 562/433 |
| 3,551,200 | 12/1970 | Stivers | 428/473.5 |
| 3,840,495 | 10/1974 | Balme et al. | 528/350 |
| 3,996,203 | 12/1976 | Hand et al. | 428/473.5 |
| 4,035,345 | 7/1977 | Ducloux et al. | 428/435 |
| 4,075,171 | 2/1978 | D'Alelio | 428/473.5 |

FOREIGN PATENT DOCUMENTS

| 869612 | 2/1979 | Belgium . |
| 1430977 | 1/1966 | France . |
| 1481935 | 4/1967 | France . |
| 1533696 | 6/1968 | France . |
| 1555564 | 12/1968 | France . |
| 2055969 | 5/1971 | France . |
| 2201289 | 4/1974 | France . |

1137592 12/1968 United Kingdom .

*Primary Examiner*—William R. Dixon, Jr.
*Attorney, Agent, or Firm*—Burns, Doane, Swecker & Mathis

[57] ABSTRACT

An active or passive electronic component is encapsulated within a bis-imido polymer molding composition, said polymer comprising (i) the thermosetting prepolymeric reaction product between a bis-imide having the structural formula:

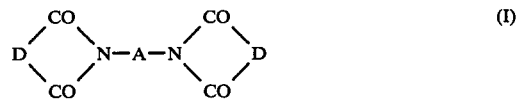

(I)

in which D represents a divalent organic radical containing an olefinic carbon-carbon double bond and A is a divalent organic radical containing from 2 to 30 carbon atoms, and a polyamine having the structural formula:

$R(NH_2)_x$ (II)

in which x is an integer equal to at least 2 and R represents an organic radical of valency x, the amount of bis-imide being 0.55 and 25 mols per mol of $NH_2$ groups provided by the polyamine; and said molding composition further comprising (ii) a free-radical polymerization initiator, and (iii) filler.

17 Claims, No Drawings

ENCAPSULATION OF ELECTRONIC COMPONENTS IN BIS-IMIDO POLYMER

BACKGROUND OF THE INVENTION

1. Field of the Invention

The present invention relates to the encapsulation of at least one electronic component by use of a molding composition comprising a thermosetting prepolymer. More especially, the present invention relates to an encapsulation process featuring low-pressure transfer and injection molding techniques.

By the term "encapsulation" as utilized herein, there is intended a process in which the electronic component is:

(i) either totally covered or enveloped within the molding composition, which thus serves as an envelope or complete casing;

(ii) or, if the component is in direct contact with a given support over one or more of its face or other surfaces, partially covered with the molding composition, which thus serves as a cover or coating for those surfaces which are not in intimate contact with the support.

2. Description of the Prior Art

The process of encapsulation by transfer is a well-known and very widespread coating method because it makes it possible to achieve high productivity and, consequently, to reduce production costs. Such process consists in placing the components to be encapsulated within the cavities of a heated mold, and in introducing or charging the molding composition into the cavities, completely filling same while enveloping said components, with the aid of a piston filling means. In order not to damage the electronic components, it is typically recommended to carry out the molding operation at a temperature which is generally between 130° and 200° C., and under a pressure which is generally below 80 kg/cm². For reasons of productivity, it is advantageous for the molding cycle to be completed within a short period of time of not more than 3 minutes.

Injection molding is a similar method, also well-known to this art, in which the molding composition is converted to the molten state and injected directly into the mold cavities by means of a screw extruder.

The aforenoted molding techniques require the use of a molding composition which, under the conditions of temperature prevailing during the molding operation, must possess a viscosity and a gellng time which have well-established values. In fact, a high viscosity can damage the electronic components, while an excessively low viscosity can be the cause of objectionable porosity.

The gelling time must correspond very precisely to values which make it possible to easily carry out each molding cycle within the short period mentioned above. An excessively short gelling time can lead to incomplete filling of the mold cavities, while excessively long gelling can allow the molding composition to flow or "flash" between the planar interface of the mold halves. These burring or flashing effects mandate additional cleaning operations, which are expensive and difficult to perform. A good balance between the parameters of viscosity and gelling time is thus essential for economic production.

The molding composition must also possess other characteristics. These relate to the following characteristics:

(i) non-flammability and non-toxicity;
(ii) chemical purity;
(iii) high heat resistance combined with good electrical properties and excellent dimensional stability;
(iv) good mechanical strength; and
(v) good adhesion to a variety of substrates, in particular to metal substrates (for example, the metal baseplates with which the electronic components may be in contact, and the connecting wires).

The molding compositions which are currently marketed are essentially epoxide resins and silicone resins. However, although their characteristics in terms of viscosity and gelling time can be well adapted to suit the molding conditions indicated above, in certain respects these resins are inadequate and do not totally satisfy the manufacturers of electronic components, in particular the manufacturers of active power components, such as, for example, diodes, transistors and integrated circuits, as well as the manufacturers of passive components, such as, for example, windings, rectifiers, ferrite antennae, condensers, resistors and connectors. An important problem which should normally be solved in the field of the encapsulation of power components, which, as is known, are materials which are typically fairly sensitive to atmospheric pollution, arises from the need to utilize a molding composition which possesses very good properties in terms of heat resistance and mechanical flexural strength; in fact, these properties govern both the leaktightness of the casings or covers and their adhesion to metal substrates.

Epoxide resins, which have high coefficients of expansion, are at the limit of their heat resistance capabilities, and silicones lack mechanical flexural properties, crack and adhere poorly to metal substrates.

SUMMARY OF THE INVENTION

Accordingly, a major object of the present invention is the provision of an improved method for the encapsulation of electronic components, which method features encapsulating such components within a particular molding composition well adapted to meet all of the physical and chemical requirements of the end user.

Briefly, the present invention features a process for encapsulating at least one electronic component, either of active or passive type, by either transfer or injection molding techniques, and which process is characterized in that the molding composition is either wholly or partially comprised of:

(a) a thermosetting prepolymer which is prepared by reacting a bis-imide having the structural formula:

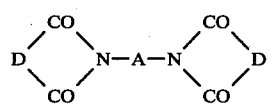 (I)

in which D represents a divalent organic radical containing an olefinic carbon-carbon double bond and A is a divalent organic radical containing from 2 to 30 carbon atoms, with a polyamine having the structural formula:

 (II)

in which x is an integer equal to at least 2 and R represents an organic radical of valency x, the amount of bis-imide being 0.55 and 25 mols per mol of $NH_2$ groups provided by the polyamine;

(b) a free-radical polymerization initiator; and
(c) fillers.

DETAILED DESCRIPTION OF THE INVENTION

More particularly according to the subject invention, there is featured an encapsulation process utilizing a molding composition comprising, as the thermosetting prepolymer, a prepolymer (a) having the following characteristics:

(1) it has a softening point between 50° and 120° C.; and (2) the change in the modulus of complex rigidity of said prepolymer as a function of time, when the prepolymer is subjected to crosslinking at 170° C., is such that, after 5 minutes, the said modulus is between $3 \times 10^4$ and $10^7$ N/m and that, after 15 minutes, it increases to values of between $3 \times 10^5$ and $3 \times 10^7$ N/m. Cf. U.S. Pat. No. Re., 29,316; French Pat. No. 1,555,564; U.S. Pat. No. 4,035,345.

The term softening point denotes the approximate temperature at which a glass rod can easily be pushed a few millimeters into the prepolymer.

The modulus of complex ridigidy is a dynamic characteristic of the prepolymer which is measured using the viscoelasticity meter known commercially by the name METRAVIB. The operating principle of this apparatus consists in subjecting a sample of the prepolymer to a sinusoidal deformation of adjustable amplitude, and in determining the force transmitted to the sample. The value of the modulus of complex rigidity (expressed in Newtons/meter) is derived directly by the apparatus from the measurements of the force transmitted to the sample and of the amplitude of the deformation movement. The higher the degree of crosslinking of the prepolymer, the greater is the force transmitted and the greater is the rigidity of the body. The change in the rigidity as a function of time thus makes it possible to characterize the prepolymer from the point of view of its crosslinking kinetics from the liquid state to the solid state. The measurement cell used is one normally used for studying liquids. To determine the value of the modulus of complex rigidity, care must be taken to ensure that the temperature of the cell is perfectly regulated so that it does not deviate by more than 2° C. or 3° C. on either side of the selected crosslinking temperature.

In the formula (I), the radical D is derived from the anhydride of an ethylenic dicarboxylic acid, having the structural formula:

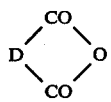
(III)

which can be maleic anhydride, citraconic anhydride, itaconic anhydride, pyrocinchonic anhydride or dichloromaleic anhydride, or also the products resulting from Diels-Alder reactions of one of these anhydrides with an acyclic, alicyclic or heterocyclic diene. As regards the anhydrides which result from a diene synthesis, reference is made, for example, to Volume IV of "Organic Reactions" (John Wiley and Sons, Inc.); tetrahydrophthalic anhydride and endomethylenetetrahydrophthalic anhydride are especially desirable.

The symbol A can represent a linear or branched chain alkylene radical having fewer than 13 carbon atoms, a phenylene radical, a cyclohexylene radical or a radical having one of the following formulae:

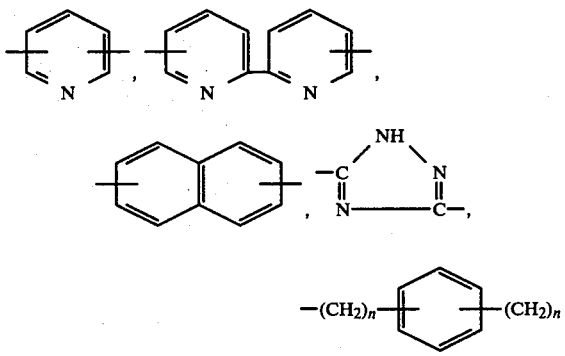

in which n represents an integer from 1 to 3. The symbol A can also include several phenylene or cyclohexylene radicals joined to one another by a single valence bond or by an inert hetero atom or group, such as —O—, —S—, an alkylene group having from 1 to 3 carbon atoms, —CO—, —$SO_2$—, —$NR_1$—, —N=N—, —CONH—, —COO—, —P(O)$R_1$—, —CONH—X—NHCO—,

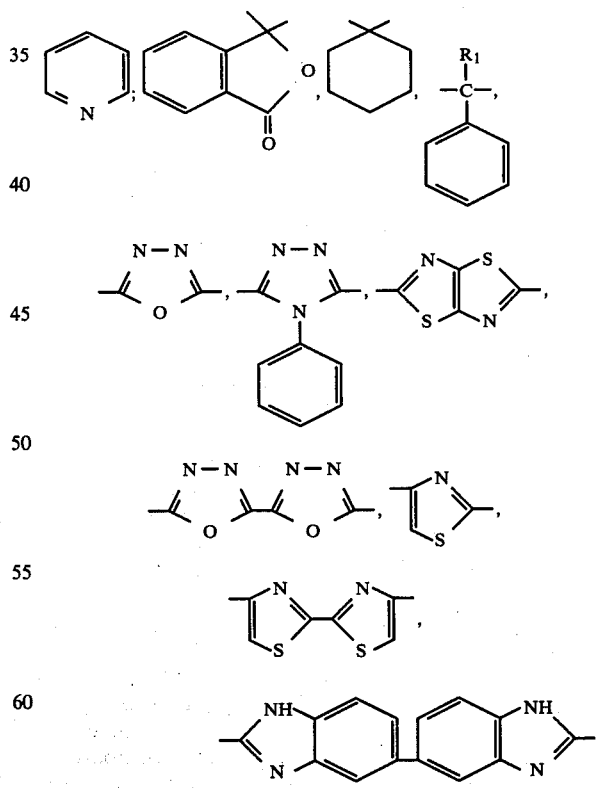

in which $R_1$ represents a hydrogen atom, an alkyl radical having from 1 to 4 carbon atoms, or a phenyl or cyclohexyl radical, and X represents an alkylene radical having fewer than 13 carbon atoms.

Moreover, the various phenylene or cyclohexylene radicals can be substituted by methyl groups.

Representative bis-imides (I) which are exemplary are N,N'-ethylene-bis-maleimide, N,N'-hexamethylene-bis-maleimide, N,N'-metaphenylene-bis-maleimide, N,N'-para-phenylene-bis-maleimide, N,N'-4,4'-diphenylmethane-bis-maleimide, N,N'-4,4'-(diphenyl ether)-bis-maleimide, N,N'-4,4'-(diphenyl sulfone)-bis-maleimide, N,N'-4,4'-dicyclohexylmethane-bis-maleimide, N,N'-4,4'-(3,5-diphenylpyridine)-bis-maleimide, N,N'-pyridine-2,6-diyl-bis-maleimide, N,N'-α,α'-4,4'-dimethylenecyclohexane-bis-maleimide, N,N'-meta-xylylene-bis-maleimide, N,N'-para-xylylene-bis-maleimide, N,N'-4,4'-diphenylcyclohexane-bis-maleimide, N,N'-4,4'-diphenylmethane-bis-citraconimide, N,N'-4,4'-(1,1-diphenylpropane)-bis-maleimide, N,N'-4,4'-(1,1,1-triphenylethane)-bis-maleimide, N,N'-4,4'-triphenylmethane-bis-maleimide, N,N'-3,5-(1,2,4-triazole)-bis-maleimide and N,N'-4,4'-biphenylene-bis-maleimide.

These bis-imides can be prepared utilizing those methods described in U.S. Pat. No. 3,018,290, French Pat. Nos. 2,055,969 and 2,201,289, British Pat. No. 1,137,592, and in Belgian Pat. No. 869,612.

The polyamine (II) can be a bis-primary diamine having the structural formula:

$$H_2N-E-NH_2 \quad (IV)$$

in which the symbol E represents one of the radicals represented by the symbol A. Exemplary bis-primary diamines which are used to prepare the prepolymer are 4,4'-diaminodicyclohexylmethane, 1,4-diaminocyclohexane, 2,6-diaminopyridine, metaphenylenediamine, para-phenylenediamine, 4,4'-diaminodiphenylmethane, 2,2-bis-(4-aminophenyl)-propane, benzidine, 4,4'-diaminodiphenyl ether, 4,4'-diaminodiphenyl sulfide, 4,4'-diaminodiphenyl sulfone, bis-(4-aminophenyl)-methylphosphine oxide, bis-(4-aminophenyl)-phenylphosphine oxide, N,N-bis-(4-aminophenyl)-methylamine, 1,5-diaminonaphthalene, hexamethylenediamine, 6,6'-diamino-2,2'-bipyridyl, 4,4'-diaminobenzophenone, 4,4'-diaminoazobenzene, bis-(4-aminophenyl)-phenylmethane, 1,1-bis-(4-aminophenyl)-cyclohexane, 2,5-bis-(m-aminophenyl)-1,3,4-oxadiazole, 2,5-bis-(p-aminophenyl)-1,3-oxadiazole, 2,5-bis-(m-aminophenyl)-thiazolo(4,5-d)thiazole, 5,5'-bis-(m-aminophenyl)-2,2'-bis-(1,3,4-oxadiazolyl), 4,4'-bis-(p-aminophenyl)-2,2'-bithiazole, m-bis-[4-(p-aminophenyl)-thiazol-2-yl]-benzene, 2,2'-bis-(m-aminophenyl)-5,5'-bibenzimidazole, 4,4'-diaminobenzanilide, 4-aminophenyl-4'-aminobenzoate, N,N'-bis-(4-aminobenzoyl)-p-phenylenediamine, 3,5-bis-(m-aminophenyl)-4-phenyl-1,2,4-triazole, 4,4'-[N,N'-bis-(p-aminobenzoyl)-diamino]-diphenylmethane, bis-p-(4-aminophenoxycarbonyl)-benzene, bis-p-(4-aminophenoxy)-benzene, 3,5-diamino-1,2,4-triazole, 1,-bis-(4-aminophenyl)-1-phenylethane, 3,5-bis-(4-aminophenyl)-pyridine, and 1,1-bis-(4-amino-3-methylphenyl)-cyclohexane.

Among the polyamines (II) other than the bis-primary diamines, those which are employed preferably have fewer than 50 carbon atoms and possess from 3 to 5 NH₂ groups per molecule. The NH₂ groups can be borne by a benzene nucleus which is optionally substituted by methyl groups, or a naphthalene, pyridine or triazine nucleus; same can also be borne by several benzene nuclei joined to one another by a single valence bond or by an inert hetero atom or group which can be one of those described above within the scope of the definition of the symbol A, or alternatively

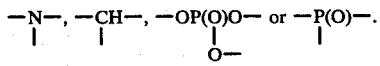

Examples of such polyamines are 1,2,4-triaminobenzene, 1,3,5-triaminobenzene, 2,4,6-triaminotoluene, 2,4,6-triamino-1,3,5-trimethylbenzene, 1,3,7-triaminonaphthalene, 2,4,4'-triaminobiphenyl, 2,4,4'-triaminodiphenylmethane, 2,4,4'-triaminodiphenyl sulfone, 2,4,4'-triaminobenzophenone, 2,4,4'-triamino-3-methyldiphenylmethane, N,N,N-tris-(4-aminophenyl)-amine, tris-(4-aminophenyl)-methane, 4,4',4''-triaminotriphenyl orthophosphate, tris-(4-aminophenyl)-phosphine oxide, 3,5,4'-triaminobenzanilide, melamine, 3,5,3',5'-tetraaminobenzophenone, 1,2,4,5-tetraaminobenzene, 2,3,6,7-tetraaminonaphthalene, 3,3'-diaminobenzidine, 3,3',4,4'-tetraaminodiphenyl ether, 3,3',4,4'-tetraaminodiphenylmethane, 3,3',4,4'-tetraaminodiphenylmethane, 3,3',4,4'-tetraaminodiphenyl sulfone, 3,5-bis-(3,4-diaminophenyl)-pyridine, 2,4,6-triaminopyridine, 2,4,4'-triaminodiphenyl ether and the oligomers of the average formula:

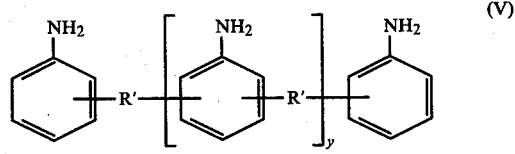

in which y represents a number ranging from about 0.1 to 2 and R' represents a divalent hydrocarbon radical having from 1 to 8 carbon atoms, which is derived from an aldehyde or a ketone of the general formula:

$$O=R' \quad (VI)$$

in which the oxygen atom is bonded to a carbon atom of the radical R'; typical aldehydes and ketones are formaldehyde, acetaldehyde, benzaldehyde, enanthaldehyde, acetone, methyl ethyl ketone, hexan-2-one, cyclohexanone and acetophenone. These oligomers with amino groups can be obtained in accordance with known processes, such as those which are described in French Pat. Nos. 1,430,977, 1,481,935 and 1,533,696; the crude mixtures of oligomers obtained in accordance with these processes can be enriched in one or more of their constituents, for example, by distillation under reduced pressure. Cf. U.S. Pat. No. 3,840,495.

The invention preferably employs a prepolymer derived from N,N'-4,4'-diphenylmethane-bis-maleimide and from 4,4'-diaminodiphenylmethane.

The prepolymer (a) which corresponds to the above-mentioned characteristics (1) and (2) can be prepared by different methods. In particular, there is mentioned the method which consists of heating the bisimide (I) and the polyamide (II) at between 50° and 200° C., the reaction being carried out in the presence of an oxygen-containing monoacid or polyacid of organic origin, in which at least one of the acid groups has an ionization constant in water, or pKa, of less than 5; the reaction can also be carried out in the presence of a mixture of two or more than two of these acids. These acids can be monocarboxylic or polycarboxylic acids, it being possible for the latter to have a simple structure or to possess groups which do not interfere with the reaction between the bis-imide (I) and the polyamine (II). Acids which are thus exemplary are acetic acid, monochloroacetic acid, dichloroacetic acid, fumaric acid, maleic acid, trimellitic acid, (ortho-, meta- or para-) phthalic acid, a bis-maleamic acid of the formula:

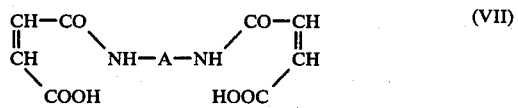

(VII)

in which the symbol A is as defined above for the formula (I), and a monomaleamic acid of the formula:

(VIII)

in which the symbol G represents a linear or branched chain alkyl radical containing from 1 to 10 carbon atoms, an aryl radical, such as a phenyl radical, which is optionally substituted by one or more alkyl groups, such as methyl groups, or a radical of the formula —E—$NH_2$, in which the symbol E is as above-defined respecting the formula (IV).

Specific examples of acids of the formulae (VII) and (VIII) are N,N'-ethylene-bis-maleamic acid, N,N'-hexamethylene-bis-maleamic acid, N,N'-meta-phenylene-bis-maleamic acid, N,N'-paraphenylene-bis-maleamic acid, N,N'-4,4'-diphenylmethane-bis-maleamic acid, N,N'-4,4'-(diphenyl ether)-bis-maleamic acid, N,N'-4,4'-(diphenyl sulfone)-bis-maleamic acid, N,N'-4,4'-dicyclohexylmethane-bis-maleamic acid, N,N'-4,4'-(diphenyl sulfide)-bis-maleamic acid, N,N'-4,4'-biphenylene-bis-maleamic acid, N,N'-4,4'-benzophenone-bis-maleamic acid, N,N'-4,4'-azobenzene-bis-maleamic acid, N,N'-4,4'-triphenylmethane-bis-maleamic acid, N-butylmonomaleamic acid, N-phenylmonomaleamic acid, N-tolylmonomaleamic acid and N-4-(4'-aminodiphenylmethane)-monomaleamic acid.

The above-mentioned maleamic acids can be prepared in accordance with known processes and, in this respect, reference is made, for example, to L. A. Flett and W. H. Gardner, "Maleic Anhydride Derivatives". The monomaleamic acids are readily obtained by introducing maleic anhydride into a molar excess of amine G—$NH_2$ or E+$NH_2)_2$ dissolved in a hydrocarbon, such as benzene, heptane or cyclohexane.

When it is desired to employ a prepolymer derived from N,N'-4,4'-diphenylmethane-bis-maleimide and from 4,4'-diaminodiphenylmethane, the preferred acids are maleic acid and/or N,N'-4,4'-diphenylmethane-bis-maleamic acid and/or N-4-(4'-aminodiphenylmethane)-mono-maleamic acid. A mixture of these acids is very particularly suitable.

The amounts by weight of acid or mixture of acids which are typically used represent from 0.5 to 5%, relative to the weight of the bis-imide (I) employed. Amounts of between 1% and 4% are very particularly suitable.

The prepolymer can be prepared in bulk by heating the reaction mixture which has been preliminarily subjected to intimate admixing using conventional techniques.

The prepolymer can also be prepared in a polar solvent, such as cresol, dimethylformamide, N-methylpyrrolidone, dimethylacetamide or chlorobenzene. It must be understood that it is possible to use a bis-imide or, alternatively, a mixture of several bis-imides. Likewise, it is apparent that the term polyamine is also to be understood as denoting mixtures of polyamines having the same number of functional groups or, alternatively, mixtures of polyamines, at least two of which have different numbers of functional groups. Generally, one or more bis-primary diamines are used, optionally in association with one or more polyamines which have a larger number of functional groups and which can constitute, by weight, up to 50% of the weight of the diamines employed. The amounts of reactants are preferably selected to provide 0.6 to 2.5 mols of bis-imide per mol of $NH_2$ groups provided by the polyamine.

The constituent (b) of the molding composition used in the process according to the invention consists of a known free-radical initiator. The initiator can be a peroxide compound, such as dilauroyl peroxide, dicumyl peroxide, di-tert.-butyl peroxide, mixed t-butyl cumyl peroxide or 2,5-dimethyl-2,5-bis-(t-butylperoxy)-hex-3-yne. The initiator can also be a diazo compound, such as α,α-azo-bis-isobutyronitrile. An organic peroxide is preferably used. The amount of initiator preferably represents 0.5 to 5% of the weight of the prepolymer (a).

It should be noted that, in a preferred embodiment of the invention, the free-radical initiator can be incorporated into the molding composition in the form of a mixture with an organopolysiloxane oil or with a combination consisting of an organopolysiloxane oil and an organopolysiloxane resin (this mixture generally has the appearance of a suspension). The oils and resins which are suitable for this purpose are, in particular, those described in French Pat. No. 2,205,552. It will also be noted that a very particularly suitable combination consists of an organopolysiloxane oil having a viscosity of between 10 and 10,000 cPo at 20° and a methylpolysiloxane resin essentially comprised of trimethylsiloxy units and $SiO_2$ units, the ratio of number of methyl groups/number of silicon atoms generally being between 0.8/1 and 1.5/1 and preferably being between 1.1/1 and 1.3/1. These resins can be prepared, for example, by the co-hydrolysis of $(CH_3)_3SiL$ and $SiL_4$, in which formulae the sumbol L represents a hydrolyzable group. If a combination consisting of the oil and the resin defined above is used, the proportion of resin is usually less than 50% of the weight of the mixture. The proportion of organopolysiloxane oil or of organopolysiloxane oil/organopolysiloxane resin combination generally represents 0.5 to 3% of the weight of the prepolymer (a).

In the description which follows, the expression "organosilicon compound" will denote either the organopolysiloxane oil or the organopolysiloxane oil/organopolysiloxane resin combination.

The constituent (c) of the molding composition is filler(s). The amount of fillers used can be up to 80% of the weight of the mixture constituting the molding composition. These fillers, which can be fibrous or pulverulent, are especially those which are described in French Pat. No. 2,029,114.

More generally, mineral fillers of fine particle size are used, such as particles of mica, talc, calcium hydrosilicate of the Wollastonite type, calcium carbonate (calcite) and magnesium carbonate (dolomite), alumina, hydrated alumina, kaolin or silica, or alternatively glass microbeads or also asbestos fibers or glass fibers. In general, the particle size of the pulverulent fillers is between 0.1 and 200μ; the length of the fibers is usually less than 5 mm. The proportion of fillers is preferably between 10 and 75%.

Very particularly suitable fillers are fused and ground silica having a particle size which is less than or equal to 100μ, calcium carbonate (calcite) or a mixture of calcium carbonate with a small proportion of dolomite, having a particle size which is less than or equal to 100μ, and mixtures of this silica or of this carbonate (these carbonates) with glass fibers having a length which is less than or equal to 0.8 mm, it being possible for the proportion of silica or of carbonate(s) in the said mixtures to vary between 20% and 80% by weight.

It is can also be advantageous to incorporate into the molding composition an agent which makes it possible to improve the release characteristics of the encapsulated articles from the mold. This is the case, in particular, if the production rates are very high. Mold-release agents which are exemplary are natural or synthetic waxes, metal stearates and castor oil. Mixtures of mold-release agents too can be used. When it is decided to use a mold-release agent, the proportion thereof represents at most 4% of the weight of the molding material.

The molding composition which can be used in the process according to the present invention can be prepared by different methods. It is thus possible to simultaneously incorporate, into the prepolymer in the solid state, the free-radical initiator (optionally mixed with the above-mentioned organosilicon compound), the fillers and optionally the mold-release agent, and then to homogenize the entire mass simply by malaxation. It will be appreciated that the fillers can be incorporated either before or after the introduction of the free-radical initiator. In the former case, it is possible either to mix the fillers with the separately prepared prepolymer or to carry out the prepolymerization of the bis-imide and the polyamine in the presence of the said fillers.

A preferred procedure consists of utilizing a free-radical initiator suspended in an organopolysiloxane oil or an organopolysiloxane oil/organopolysiloxane resin combination, and in carrying out the following steps in succession:

(i) using a conventional powder mixer, the prepolymer is mixed with the initiator/organosilicon compound suspension, the said suspension being poured onto the prepolymer in the solid state or into a mixture, prepared beforehand, of the prepolymer and the mold-release agent, and the fillers are then incorporated into the entire mass obtained; and (ii) the molding composition is then homogenized using a malaxator of the screw extruder type. Apparatus of this kind can comprise one or more worm screws and can be equipped with a system which makes it possible to effect controlled heating of the malaxation zone. The heating can be carried out in a uniform manner over the entire length of the malaxation zone, but it is also possible to arrange several contiguous heating zones providing the malaxation zone with a temperature which, for example, increases in the direction of advance of the material. A temperature in the malaxation zone of between 50° and 120° C., and a residence time of the molding composition in the said zone of between 2 and 10 minutes, are generally suitable.

For reasons of convenience, the initiator/organosilicon compound suspension can be used in the form of a mixture, prepared separately, of the said suspension and a diluent, such as, for example, a petroleum distillation fraction of low boiling point, such as white spirit. The proportion of diluent can be up to 50% of the weight of the initiator/organosilicon compound suspension. This measure makes it possible to obtain a solution of initiator in the organosilicon compound.

After it has been homogenized, the molding composition is generally subjected to a grinding operation such as to provide a particle size therefor of between about 30 and 6,000μ.

The composition which has now been described can be molded under mild conditions, namely, at temperatures between 130° and 200° C. and under transfer pressures of between 20 and 60 kg/cm$^2$. Same permits high molding rates and causes only minimum burring or flashing.

During the encapsulation operation, which is carried out at a temperature above the softening point of the prepolymer and above the decomposition point of the initiator, the prepolymer is converted or cured into a three-dimensional resin, and this imparts, to the composite shaped articles obtained, good mechanical properties and high heat stability, which are superior to those hitherto reported vis-a-vis the epoxide or silicone resins. After molding, the resultant shaped articles can be subjected to a post-curing operation for about 4 to 48 hours at a temperature which can reach 250° C.

In order to further illustrate the present invention and the advantages thereof, the following specific example is given, it being understood that same is intended only as illustrative and in nowise limitative.

EXAMPLE

[A] Preparation of Molding Composition (1) Materials 1.1. Prepolymer

The prepolymer was prepared by heating to 150° C., in bulk, a mixture of N,N'-4,4'-diphenylmethane-bis-maleimide, 4,4'-diaminodiphenylmethane, maleic acid, N,N'-4,4'-diphenylmethane-bis-maleamic acid and N-4-(4'-aminodiphenylmethane)-monomaleamic acid. The molar ratio bis-imide/diamine was equal to 2.5. The total amount of acids present represented 2.3% of the weight of the bis-imide employed, same having been divided up as follows: 0.65% of maleic acid, 1.2% of bis-maleamic acid and 0.45% of monomaleamic acid. This prepolymer softened at 70° C. If this prepolymer was crosslinked at 170° C., it was found that its rigidity was $3.6 \times 10^5$ N/m after 5 minutes and $1.5 \times 10^7$ N/m after 15 minutes.

1.2. Mold-releasing mixture

Same was prepared by mixing two mold-release agents, namely, castor oil (1 part by weight) and zinc stearate (1 part by weight), with the prepolymer (8 parts by weight).

The mixture was formed by melting the entire mass in an oven for 30 minutes and then grinding.

1.3. Solution of free-radical initiator

Same was prepared by mixing the following ingredients at ambient temperature (20° to 25° C.): dicumyl peroxide (0.5 part by weight), di-tert.-butyl peroxide (0.75 part by weight), an organopolysiloxane composition comprising 70% by weight of a dimethylpolysiloxane oil, the ends of which were blocked or terminated with trimethylsilyl groups (viscosity: 300 cPo at 25° C.), and 30% by weight of a methylpolysiloxane resin consisting of trimethylsiloxy and $SiO_2$ units (1 part by weight), and white spirit (1 part by weight).

1.4. Fillers

Same consisted of a mixture of glass fibers having a length of 0.8 mm, marketed by the Société Owens Corning Fiberglass under the reference P 117 B (1 part by weight), and fused silica marketed by the Société Glassrock under the reference GP 71 (2 parts by weight).

(2) Mixing of the Materials

A 10 liter Henschel powder mixer was used (speed of rotation: 1,800 rpm). The following operations were then carried out, each operation lasting about 3 minutes:

(i) 1,050 g of prepolymer were introduced into the mixer, and 120 g of mold-releasing mixture were then added;

(ii) 39 g of free-radical initiator solution were then poured onto the mass (i); and (iii) the two fillers were then mixed into the entire mass consisting of (i)+(ii).

(3) Homogenization and Grinding of the Molding Material

The entire mass consisting of (i)+(ii)+(iii) was homogenized using a twin-screw malaxator marketed by the Societe Creusot-Loire under the name "RCB type". The screw was housed in a body comprising two cylindrical envelopes. In the first envelope, which corresponds to the feed zone of the malaxator, a fluid heated to 95°–100° C. was circulated. In the second envelope, which corresponds to the malaxation zone, a fluid heated to 100°–110° C. was circulated. The speed of rotation of the screws was 12 rpm. The mean residence time of the material in the malaxator was on the order of 3 to 5 minutes.

At the outlet of the malaxator, a mass was collected which, after cooling, was ground in order to obtain particles having the following size distribution:

60 to 100μ: 34%
100 to 500μ: 40.8%
500 to 1,000μ: 7.1%
1,000 to 2,000μ: 10.4%
2,000 to 3,150μ: 7.7%

The flow of the molding powder obtained was studied in accordance with the Standard Specification defined by Epoxy Molding Materials Institute (EMMI 1-66). This test consisted in measuring, after transfer molding, the length of a spiral groove filled by the powder. The flow of the molding powder obtained was 35 to 40 inches (pressure: 70 kg/cm²; temperature: 150°; charging with cold pellets of powder, having a weight of 20 g and a diameter of 25 mm).

[B] Molding (1) A transfer molding experiment was carried out without introducing electronic components into the cavities of the mold. The purpose of this experiment was to illustrate the good behavior of the molding composition itself, within the scope of the subject encapsulation technique.

The mold used was a TO 126 type rectifier module consisting of 2 bars with 28 cavities. This mold comprised:

(i) a central feed inlet channel making it possible to distribute the molding composition into the cavities; its length was 125 mm and its cross-section was 13.5 cm²; and (ii) on either side of the said channel, 14 cavities of dimensions 11×7×3 mm (volume of 230 mm³), located next to one another; each cavity was connected to the central channel via an inlet orifice having a cross-section of 1.8 mm².

The molding composition was converted into pellets having a diameter of 25 mm and a weight of 15 g, and these pellets were preheated for about 50 seconds by heating at a frequency of 40 MHz, in order to provide a core temperature of 90° to 100° C., before being introduced into the transfer chamber of the mold.

The filling of the cavities by transfer of the molding composition was effected under the following conditions:

(i) Temperature of the mold: 180°–185° C.;
(ii) Transfer pressure: 40 kg/cm²;
(iii) Molding time: 2 minutes.

It was noted that the cavities of the mold were correctly filled and that there were no burring effects or only very slight burring effects.

The articles obtained were then baked for 24 hours at 200° C. (under atmospheric pressure). Same possessed the following physico-mechanical characteristics:

(i) Flexural strength (ASTM Standard Specification D 790):
 at ambient temperature: 8.7 kg/mm²
 at 200° C.: 4.4 kg/mm²
(ii) Flexural modulus (ASTM Standard Specification D 790):
 at ambient temperature: 1,470 kg/mm²
 at 200° C.: 1,210 kg/mm²
(iii) Linear coefficient of expansion:
 10 to 11.6 × $10^{-6}$ cm/cm/°C.

(2) An experiment for the encapsulation of ferrite antennae using the molding composition prepared in paragraph [A] will now be described.

The mold used comprised 2 feed channels located on either side of the transfer chamber for the molding material. These channels each had a length of 80 mm and a cross-section of 8.75 mm². Each channel fed 5 cylindrical cavities which were located next to one another and each had a length of 18.5 mm and a diameter of 7.5 mm. Each cavity was connected to the feed inlet channel via 2 inlet orifices of cross-section 1.2 mm². Each cavity received a ferrite antenna having a length of 12 mm and a diameter of 4 mm.

The molding composition was converted to pellets (diameter: 25 mm; weight: 16 g) which were preheated for about 40 seconds by heating at a frequency of 40 MHz in order to obtain a core temperature of 85° to 90° C.

The filling, by transfer, of the cavities containing the ferrite antennae was effected under the following conditions:

(i) Temperature of the mold: 185° C.
(ii) Transfer pressure: 45 kg/cm²
(iii) Molding time: 2 minutes.

After baking for 24 hours at 200° C., the encapsulated ferrite antennae were subjected to thermal shock cycles at between −55° C. and +200° C.; each cycle consisted of the following:

(i) 10 minutes at −55° C.,
(ii) then 10 minutes at ambient temperature (20°–25° C.), and
(iii) then 10 minutes at +200° C.

No cracking was recorded after ten cycles.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. An article of manufacture which comprises an electronic component encapsulated within a bisimido polymer molding composition, said polymer comprising (i) the thermosetting prepolymer consisting essentially of the reaction product obtained upon reacting a bis-imide having the structural formula:

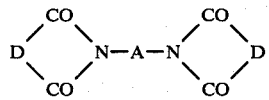

in which D represents a divalent organic radical containing an olefinic carbon-carbon double bond and A is a divalent organic radical containing from 2 to 30 carbon atoms, and a polyamine having the structural formula:

in which x is an integer equal to at least 2 and R represents an organic radical of valency x, the amount of bis-imide being from 0.55 to 25 mols per mol of $NH_2$ groups provided by the polyamine and wherein said thermosetting prepolymer has a softening point between 50° C. and 120° C., and the change in the modulus of complex rigidity thereof as a function of time, upon curing at 170° C., is such that, after 5 minutes, said modulus ranges from $3 \times 10^4$ to $10^7$ N/m and that, after 15 minutes, same has increased to a value ranging from $3 \times 10^5$ to $3 \times 10^7$ N/m; and said molding composition further comprising (ii) a freeradical polymerization initiator, and (iii) filler.

2. The article of manufacture as defined by claim 1, the bis-imide (I) being selected from the group consisting of N,N'-ethylene-bis-maleimide, N,N'-hexamethylene-bis-maleimide, N,N'-metaphenylene-bis-maleimide, N,N'-para-phenylene-bis-maleimide, N,N'-4,4'-diphenylmethane-bis-maleimide, N,N'-4,4'-(diphenyl ether)-bis-maleimide, N,N'-4,4'-(diphenyl sulfone)-bis-maleimide, N,N'-4,4'-dicyclohexylmethane-bis-maleimide, N,N'-4,4'(3,5-diphenylpyridine)-bis-maleimide, N,N'-pyridine-2,6-diyl-bis-maleimide, N,N'-α,α'-4,4'-dimethylenecyclohexane-bis-maleimide, N,N'-meta-xylylene-bis-maleimide, N,N'-para-xylylene-bis-maleimide, N,N'-4,4'-diphenylcyclohexane-bis-maleimide, N,N'-4,4'-diphenylmethane-bis-critraconimide, N,N'-4,4'-(1,1-diphenylpropane)-bis-maleimide, N,N'-4,4'-(1,1,1-triphenylethane)-bis-maleimide, N,N'-4,4'-triphenylmethane-bis-maleimide, N,N'-3,5-(1,2,4-triazole)-bis-maleimide and N,N'-4,4'-biphenylene-bis-maleimide.

3. The article of manufacture as defined by claim 2, the polyamine (II) being selected from the group consisting of 4,4'-diaminodicyclohexylmethane, 1,4-diaminocyclohexane, 2,6-diaminopyridine, meta-phenylenediamine, para-phenylenediamine, 4,4'-diaminodiphenylmethane, 2,2-bis-(4-aminophenyl)-propane, benzidine, 4,4'-diaminodiphenyl ether, 4,4'-diaminodiphenyl sulfide, 4,4'-diaminodiphenyl sulfone, bis-(4-aminophenyl)-methylphosphine oxide, bis-(4-aminophenyl)-phenylphosphine oxide, N,N-bis-(4-aminophenyl)-methylamine, 1,5-diaminonaphthalene, hexamethylenediamine, 6,6'-diamino-2,2'-bipyridyl, 4,4'-diaminobenzophenone, 4,4'-diaminoazobenzene, bis-(4-aminophenyl)-phenylmethane, 1,1-bis-(4-aminophenyl)-cyclohexane, 2,5-bis-(m-aminophenyl)-1,3,4-oxadiazole, 2,5-bis-(p-aminophenyl)-1,3-oxadiazole, 2,5-bis-(m-aminophenyl)-thiazole(4,5-d)thiazole, 5,5'-bis-(m-aminophenyl)-2,2'-bis-(1,3,4-oxadiazolyl), 4,4'-bis-(p-aminophenyl)-2,2'-bithiazole, m-bis-[4-(p-aminophenyl)-thiazol-2-yl]-benzene, 2,2'-bis-(m-aminophenyl)-5,5'-bibenzimidazole, 4,4'-diaminobenzanilide, 4-aminophenyl-4'-aminobenzoate, N,N'-bis-(4-aminobenzoyl)-p-phenylenediamine, 3,5-bis-(m-aminophenyl)-4-phenyl-1,2,4-triazole, 4,4'-[N,N'-bis-(p-aminobenzoyl)-diamino]-diphenylmethane, bis-p-(4-aminophenoxycarbonyl)-benzene, bis-p-(4-aminophenoxy)-benzene, 3,5-diamino-1,2,4-triazole, 1,1-bis-(4-aminophenyl)-1-phenylethane, 3,5-bis-(4-aminophenyl)-pyridine, 1,1-bis-(4-amino-3-methylphenyl)-cyclohexane, 1,2,4-triaminobenzene, 1,3,5-triaminobenzene, 2,4,6-triaminotoluene, 2,4,6-triamino-1,3,5-trimethylbenzene, 1,3,7-triaminonaphthalene, 2,4,4'-triaminobiphenyl, 2,4,4'-triaminodiphenylmethane, 2,4,4'-triaminodiphenyl sulfone, 2,4,4'-triaminobenzophenone, 2,4,4'-triamino-3-methyldiphenylmethane, N,N,N-tris-(4-aminophenyl)-amine, tris-(4-aminophenyl)-methane, 4,4',4''-triaminotriphenyl orthophosphate, tris-(4-aminophenyl)-phosphine oxide, 3,5,4'-triaminobenzanilide, melamine, 3,5,3',5'-tetraaminobenzophenone, 1,2,4,5-tetraaminobenzene, 2,3,6,7-tetraaminonaphthalene, 3,3'-diaminobenzidine, 3,3',4,4'-tetraaminodiphenyl ether, 3,3',4,4'-tetraaminodiphenylmethane, 3,3',4,4'-tetraaminodiphenylmethane, 3,3',4,4'-tetraaminodiphenyl sulfone, 3,5-bis-(3,4-diaminophenyl)-pyridine, 2,4,6-triaminopyridine, 2,4,4'-triaminodiphenyl ether and the oligomers having the average structural formula:

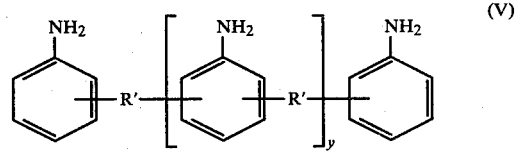

in which y represents a number ranging from about 0.1 to 2 and R' represents a divalent hydrocarbon radical having from 1 to 8 carbon atoms.

4. The article of manufacture as defined by claim 3, this bis-imide (I) being N,N'-4,4'-diphenylmethane-bis-maleimide.

5. The article of manufacture as defined by claim 4, the polyamine (II) being 4,4'-diaminodiphenylmethane.

6. The article of manufacture as defined by claim 1, the free-radical polymerization initiator (ii) being in solution or suspension in an organopolysiloxane oil.

7. The article of manufacture as defined by claim 1, the free-radical polymerization initiator (ii) being in solution or suspension in an admixture of an organopolysiloxane oil and an organopolysiloxane resin.

8. The article of manufacture as defined by any of claims 1, 6 or 7, the free-radical polymerization initiator being an organic peroxide.

9. The article of manufacture as defined by claim 1, the filler (iii) comprising from 10 to 75% by weight of said molding composition.

10. The article of manufacture as defined by claim 1, the molding composition further comprising a mold-release agent.

11. The article of manufacture as defined by claim 1, the bis-imido polymer having been thermoset.

12. The article of manufacture of claim 1, the electronic component encapsulated being an active electronic component.

13. The article of manufacture of claim 1, the electronic component encapsulated being a passive electronic component.

14. The article of manufacture as defined by claim 11, the electronic component encapsulated being an active electronic component.

15. The article of manufacture as defined by claim 11, the electronic component encapsulated being a passive electronic component.

16. A method for the fabrication of the article of manufacture as defined by claim 1, comprising introducing the electronic component to be encapsulated within a mold cavity, and thence completely filling said mold cavity by transfer or injection molding an homogenized admixture of said molding composition about said electronic component.

17. A method for the fabrication of the article of manufacture as defined by claim 11, comprising introducing the electronic component to be encapsulated within a mold cavity, next completely filling said mold cavity by transfer or injection molding an homogenized admixture of said molding composition about said electronic component, and thence post-curing said thermosetting molding composition.

* * * * *